United States Patent
Wood et al.

(10) Patent No.: US 8,266,503 B2
(45) Date of Patent: Sep. 11, 2012

(54) APPARATUS, SYSTEM, AND METHOD FOR USING MULTI-LEVEL CELL STORAGE IN A SINGLE-LEVEL CELL MODE

(75) Inventors: Robert Wood, Niwot, CO (US); Jea Woong Hyun, South Jordan, UT (US)

(73) Assignee: Fusion-io, Salt Lake City, UT (US)

( * ) Notice: Subject to any disclaimer, the term of this patent is extended or adjusted under 35 U.S.C. 154(b) by 0 days.

(21) Appl. No.: 13/175,637

(22) Filed: Jul. 1, 2011

(65) Prior Publication Data

US 2012/0173827 A1 Jul. 5, 2012

Related U.S. Application Data

(63) Continuation-in-part of application No. 12/724,401, filed on Mar. 15, 2010.

(60) Provisional application No. 61/160,258, filed on Mar. 13, 2009.

(51) Int. Cl.
*G11C 29/00* (2006.01)
(52) U.S. Cl. .................... 714/773; 365/185.03
(58) Field of Classification Search .......... 365/185.18, 365/185.03; 711/103; 714/721, 769, 773
See application file for complete search history.

(56) References Cited

U.S. PATENT DOCUMENTS

| | | | |
|---|---|---|---|
| 5,515,317 A | 5/1996 | Wells et al. | |
| 5,541,886 A | 7/1996 | Hasbun | |
| 6,097,637 A | 8/2000 | Bauer et al. | |
| 6,125,072 A | 9/2000 | Wu | |
| 6,895,543 B2 | 5/2005 | Hazama | |
| 7,133,311 B2 | 11/2006 | Liu | |
| 7,257,027 B2 | 8/2007 | Park | |
| 7,272,041 B2 | 9/2007 | Rahman et al. | |
| 7,301,807 B2 | 11/2007 | Khalid et al. | |
| 7,369,434 B2 | 5/2008 | Radke | |
| 7,466,575 B2 | 12/2008 | Shalvi et al. | |
| 7,466,597 B2 | 12/2008 | Kim | |
| 7,593,263 B2 | 9/2009 | Sokolov et al. | |
| 7,646,636 B2 | 1/2010 | Kim | |
| 7,697,326 B2 | 4/2010 | Sommer et al. | |
| 7,706,182 B2 | 4/2010 | Shalvi et al. | |
| 7,751,240 B2 | 7/2010 | Shalvi | |
| 7,773,413 B2 | 8/2010 | Shalvi | |
| 7,821,826 B2 | 10/2010 | Shalvi et al. | |

(Continued)

OTHER PUBLICATIONS

ASPMC_660, Asine Group, available at http://www.asinegroup.com/products/aspm660.html, copyright 2002, last accessed on Jul. 10, 2012, 1 page.

(Continued)

*Primary Examiner* — David Ton
(74) *Attorney, Agent, or Firm* — Jeffrey T. Holman

(57) ABSTRACT

A controller is used for an electronic memory device which has multi-level cell (MLC) memory elements. Each MLC memory element is capable of storing at least two bits. The controller includes a physical interface to couple the controller to the electronic memory device. The controller also includes a processing unit coupled to the physical interface. The processing unit operates the electronic memory device in a single-level cell (SLC) mode using a restricted number of programming states for a single data bit. The restricted number of programming states includes a first state which is an erase state. The restricted number of programming states also includes a second state, other than the erase state, which is closest to a natural threshold voltage of the MLC memory elements.

20 Claims, 3 Drawing Sheets

U.S. PATENT DOCUMENTS

| | | | |
|---|---|---|---|
| 7,848,141 B2 | 12/2010 | Seong et al. | |
| 7,864,573 B2 | 1/2011 | Perlmutter et al. | |
| 7,881,107 B2 | 2/2011 | Shalvi | |
| 7,900,102 B2 | 3/2011 | Sokolov et al. | |
| 7,941,592 B2 | 5/2011 | Bonella et al. | |
| 8,036,030 B2 | 10/2011 | Seong et al. | |
| 2006/0028875 A1 | 2/2006 | Avraham et al. | |
| 2007/0132452 A1 | 6/2007 | Alsop | |
| 2007/0132453 A1 | 6/2007 | Ogino | |
| 2007/0132456 A1 | 6/2007 | Salman et al. | |
| 2007/0132457 A1 | 6/2007 | Okamoto et al. | |
| 2007/0132458 A1 | 6/2007 | Allen, Jr. | |
| 2007/0260817 A1 | 11/2007 | Ha | |
| 2008/0026203 A1 | 1/2008 | Gates et al. | |
| 2008/0053472 A1 | 3/2008 | Hadden | |
| 2008/0053473 A1 | 3/2008 | Lee | |
| 2008/0055987 A1 | 3/2008 | Ruf et al. | |
| 2008/0068747 A1 | 3/2008 | Sasaki et al. | |
| 2008/0080250 A1* | 4/2008 | Lee | 365/185.18 |
| 2008/0111058 A1 | 5/2008 | Feldman et al. | |
| 2008/0126680 A1 | 5/2008 | Lee et al. | |
| 2008/0126686 A1 | 5/2008 | Sokolov et al. | |
| 2008/0130341 A1 | 6/2008 | Shalvi et al. | |
| 2008/0139441 A1 | 6/2008 | Xiao et al. | |
| 2008/0148115 A1 | 6/2008 | Sokolov et al. | |
| 2008/0158958 A1 | 7/2008 | Sokolov et al. | |
| 2008/0172520 A1 | 7/2008 | Lee | |
| 2008/0172521 A1 | 7/2008 | Lee | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0215930 A1 | 9/2008 | Radke | |
| 2008/0219050 A1 | 9/2008 | Shalvi et al. | |
| 2008/0263262 A1 | 10/2008 | Sokolov et al. | |
| 2008/0282106 A1 | 11/2008 | Shalvi et al. | |
| 2008/0288716 A1 | 11/2008 | Arakawa | |
| 2009/0024905 A1 | 1/2009 | Shalvi et al. | |
| 2009/0037691 A1 | 2/2009 | Master et al. | |
| 2009/0043951 A1 | 2/2009 | Shalvi et al. | |
| 2009/0046509 A1 | 2/2009 | Annavajjhala et al. | |
| 2009/0049366 A1 | 2/2009 | Toda | |
| 2009/0050703 A1 | 2/2009 | Lifson et al. | |
| 2009/0063450 A1 | 3/2009 | Petri | |
| 2009/0091979 A1 | 4/2009 | Shalvi | |
| 2009/0103358 A1 | 4/2009 | Sommer et al. | |
| 2009/0106485 A1 | 4/2009 | Anholt | |
| 2009/0144600 A1 | 6/2009 | Perlmutter et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0187803 A1 | 7/2009 | Anholt et al. | |
| 2009/0193184 A1 | 7/2009 | Yu et al. | |
| 2009/0199074 A1 | 8/2009 | Sommer | |
| 2009/0213653 A1 | 8/2009 | Perlmutter et al. | |
| 2009/0213654 A1 | 8/2009 | Perlmutter et al. | |
| 2009/0228761 A1 | 9/2009 | Perlmutter et al. | |
| 2009/0240872 A1 | 9/2009 | Perlmutter et al. | |
| 2009/0244963 A1 | 10/2009 | Karpov et al. | |
| 2009/0327590 A1 | 12/2009 | Moshayedi | |
| 2010/0091535 A1 | 4/2010 | Sommer et al. | |
| 2010/0110787 A1 | 5/2010 | Shalvi et al. | |
| 2010/0115376 A1 | 5/2010 | Shalvi et al. | |
| 2010/0122016 A1* | 5/2010 | Marotta et al. | 711/103 |
| 2010/0124088 A1 | 5/2010 | Shalvi et al. | |
| 2010/0131826 A1 | 5/2010 | Shalvi et al. | |
| 2010/0131827 A1 | 5/2010 | Sokolov et al. | |
| 2010/0153632 A1* | 6/2010 | Lee et al. | 711/103 |
| 2010/0157641 A1 | 6/2010 | Shalvi et al. | |
| 2010/0157675 A1 | 6/2010 | Shalvi et al. | |
| 2010/0165689 A1 | 7/2010 | Rotbard et al. | |
| 2010/0165730 A1 | 7/2010 | Sommer et al. | |
| 2010/0195390 A1 | 8/2010 | Shalvi | |
| 2010/0199150 A1 | 8/2010 | Shalvi et al. | |
| 2010/0205352 A1 | 8/2010 | Chu et al. | |
| 2010/0220509 A1 | 9/2010 | Sokolov et al. | |
| 2010/0220510 A1 | 9/2010 | Shalvi | |
| 2010/0226165 A1 | 9/2010 | Kang et al. | |
| 2010/0250836 A1 | 9/2010 | Sokolov et al. | |
| 2010/0332955 A1 | 12/2010 | Anholt | |
| 2011/0013451 A1* | 1/2011 | Han | 365/185.03 |
| 2011/0292725 A1* | 12/2011 | Choi et al. | 365/185.03 |
| 2012/0020155 A1* | 1/2012 | Kim | 365/185.03 |

OTHER PUBLICATIONS

"BiTMICRO Introduces E-Disk PMC Flash Disk Module at Military & Aerospace Electronics East" BiTMICRO, available at http://www.bitmicro.com/press_news_releases_20040518_prt.php, last accessed Jul. 10, 2012, 2 pages.

"Method of Error Correction in a Multi-BitPer-Cell Flash Memory" IP.com Prior Art Database Technical Disclosures, IPCOM000147010D, (Mar. 4, 2007).

"Multi-Bit-Per-Cell Flash Memory Device with Non-Bijective Mapping" IP.com Prior Art database Technical Disclosure, IPCOM000141835D, (Oct. 16, 2006).

"NAND Flash 101: An Introduction to NAND Flash and How to Design It in to Your Next Product" Micron Technology, (Nov. 2006), 27 pages.

"Probablistic Error Correction in Multi-Bit-Per-Cell Flash Memory" IP.com Prior Art Database Technical Disclosure, IPCOM000141833D, (Oct. 16, 2006).

"SLC vs. MLC: An Analysis of Flash Memory" Super Talent Technology, Inc., SLC vs. MLC: Whitepaper, last accessed Jul. 10, 2012, 9 pages.

Chang "Hybrid Solid-State Disks: Combining Heterogeneous NAND Flash in Large SSDs" Design Automation Conference (Mar. 2008), pp. 428-433.

Cho et al. "A Dual-Mode NAND Flash Memory: 1-Gb Multilevel and High-Performance 512-Mb Single-Level Modes" IEEE Journal of Solid-State Circuits, vol. 36, Issue 11, (Nov. 2001), pp. 1700-1706.

Dan et al. "Implementing MLC NAND Flashf or Cost-Effective, High-Capactiy Memory" M-Systems, (Jan. 2003), 14 pages.

Harris "PCM Flash Killer or Flash Road Kill?" Storage Bits, available at http://www.zdnet.com/blog/storage/pcm-flash-killer-or-flash-road-kill/1080, last accessed Jul. 10, 2012, 3 pages.

Qureshi et al. "Morphable Memory System: A Robust Architecture for Exploiting Multi-Level Phase Change Memories" Proceedings of the 37th Annual International Symposium on Computer Architecture, pp. 153-162 (Jun. 2010).

Yaakobi et al. "Efficient Coding Schemes for Flash Memories" Flash Memory Summit (Aug. 2010), 142 pages.

Zhang et al. "Characterizing and Mitigating the Impact of Process Variations on Phase Change Based Memory Systems" Proceedings of the 42nd Annual IEEE/ACM International Symposium on Microarchitecture, 12 pages. (Dec. 2009).

* cited by examiner

APPARATUS, SYSTEM, AND METHOD FOR USING MULTI-LEVEL CELL STORAGE IN A SINGLE-LEVEL CELL MODE

CROSS-REFERENCE TO RELATED APPLICATIONS

This application is a continuation-in-part of U.S. application Ser. No. 12/724,401 (U.S. Pat. Pub. No. 20100235715), entitled "Apparatus, System, and Method for Using Multi-Level Cell Solid-State Storage as Single-Level Cell Solid-State Storage," filed on Mar. 15, 2010, which claims the benefit of U.S. Provisional Patent Application No. 61/160,258, entitled "Apparatus, System, and Method for Using Multi-Level Cell Solid-State Storage as Single-Level Cell Solid-State Storage," filed on Mar. 13, 2009, both of which are incorporated by reference herein.

BACKGROUND

Some conventional flash memory and other solid-state storage devices implement multi-level cell (MLC) memory elements to store multiple bits of data in the same memory cell. In general, the MLC memory elements are programmable to multiple states, which are each characterized by separate voltage thresholds. As an example, a two-bit MLC memory element can be programmed to one of four different states, each state corresponding to a unique voltage range.

Storing multiple bits of data in the same memory element increases the capacity of the flash memory. However, this approach also typically decreases the longevity of the device in various ways, including the number of times each memory element can be accurately written, the number of times each memory element can be accurately read per write, and the ability to maintain the accuracy of the data, for example, when the flash memory is not powered, is operating at high temperatures, or under other conditions. While the availability of increased capacity may drive the use of MLC memory element in flash memory, the possibility of decreased accuracy or product life can be a deterrent. By way of comparison, single-level cell (SLC) memory elements may have better accuracy and/or longer life, but are typically more expensive to manufacture (i.e., greater cost per bit).

As a compromise between MLC and SLC memory elements, some flash memory and other solid-state storage devices implement an SLC mode using MLC memory elements. In this mode, each MLC memory element is used to store a single bit, rather than multiple bits. This approach may provide improved accuracy and/or longevity compared with conventional MLC memory devices, while maintaining a lower cost per bit than conventional SLC memory devices.

SUMMARY

Embodiments of a method are described. In one embodiment, the method is a method for storing data in an electronic memory device. An embodiment of the method includes receiving a write command to write data to an electronic memory device having multi-level cell (MLC) memory elements. Each MLC memory element is programmable to designated programming states. Each designated programming state is representative of at least two bits of data. An embodiment of the method also includes programming at least one of the MLC memory elements to one of a plurality of restricted programming states in a single-level cell (SLC) mode to represent at most a single bit of data at each of the restricted programming states. The restricted programming states exclude at least one of the designated programming states. The restricted programming states include a first state which is an erase state. The restricted programming states also include at least a second state, other than the erase state, which is closest to a natural threshold voltage of the MLC memory elements. Other embodiments of the method are also described.

Embodiments of a computer program product are also described. In one embodiment, the computer program product includes a computer readable storage device to store a computer readable program, wherein the computer readable program, when executed by a processor within a computer, causes the computer to perform operations for storing data in an electronic memory device. The operations include receiving a write command to write the data to an electronic memory device having multi-level cell (MLC) memory elements. Each MLC memory element is programmable to $2^X$ designated programming states. Each designated programming state is representative of X bits of data, where X>1. The operations also include programming at least one of the MLC memory elements to one of a plurality of restricted programming states in a reduced-level cell (RLC) mode to represent Y bits of the data, where Y<X. The restricted programming states exclude at least one of the designated programming states. The restricted programming states include a first state which is an erase state. The restricted programming states also include a second state, other than the erase state, which is closest to a natural threshold voltage of the MLC memory elements. Other embodiments of the computer programming product are also described.

Embodiments of an apparatus are also described. In one embodiment, the apparatus is a controller for an electronic memory device having multi-level cell (MLC) memory elements. Each MLC memory element is capable of storing at least two bits. An embodiment of the controller includes a physical interface to couple the controller to the electronic memory device. The controller also includes a processing unit coupled to the physical interface. The processing unit operates the electronic memory device in a single-level cell (SLC) mode using a restricted number of programming states for a single data bit. The restricted number of programming states includes a first state which is an erase state. The restricted number of programming states also includes a second state, other than the erase state, which is closest to a natural threshold voltage of the MLC memory elements. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
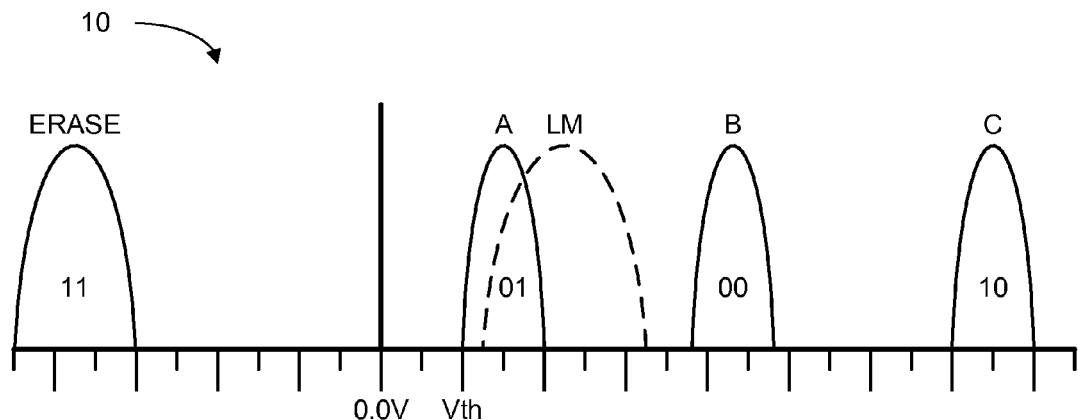
FIG. 1 illustrates a graphical diagram of voltage distributions which constitute different programming states of a programming model that may be used in conjunction with a MLC mode.

Many of the functional units described in this specification have been labeled as modules, in order to more particularly emphasize their implementation independence. Modules are at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented using software, stored on a physical storage device (e.g., a computer readable storage medium), for execution by various types of processors. Examples of a computer-readable storage medium include, but are not limited to, a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several storage or memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more physical devices which are referred to herein as computer readable media.

In some embodiments, the software portions are stored in a non-transitory state such that the software portions, or representations thereof, persist in the same physical location for a period of time. Additionally, in some embodiments the software portions are stored on one or more non-transitory storage devices, which include hardware elements capable of storing non-transitory states and/or signals representative of the software portions, even though other portions of the non-transitory storage devices may be capable of altering and/or transmitting the signals. One example of a non-transitory storage device includes a read-only memory (ROM) which can store signals and/or states representative of the software portions for a period of time. However, the ability to store the signals and/or states is not diminished by further functionality of transmitting signals that are the same as or representative of the stored signals and/or states. For example, a processor may access the ROM to obtain signals that are representative of the stored signals and/or states in order to execute the corresponding software instructions.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any physical form capable of storing machine-readable instructions, at least for a time in a non-transient state, on a digital processing apparatus. A computer readable medium may be embodied by a compact disk, digital-video disk, a magnetic tape, a Bernoulli drive, a magnetic disk, flash memory, integrated circuits, or other digital processing apparatus memory device.

Furthermore, the described features, structures, or characteristics of embodiments of the invention may be combined in any suitable manner in one or more embodiments. In the following description, numerous specific details are provided, such as examples of programming, software modules (stored on a physical device), user selections, network transactions, database queries, database structures, hardware modules, hardware circuits, hardware chips, etc., to provide a thorough understanding of embodiments of the invention. One skilled in the relevant art will recognize, however, that embodiments of the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled operations are indicative of one embodiment of the presented method. Other operations and methods may be conceived that are equivalent in function, logic, or effect to one or more operations, or portions thereof, of the illustrated method. Additionally, the format and symbols employed are provided to explain the logical operations of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated operations of the depicted method. Additionally, the order in which a particular method occurs may or may not strictly adhere to the order of the corresponding operations shown.

While many embodiments are described herein, at least some of the described embodiments implement a single-level cell (SLC) mode within a multi-level cell (MLC) memory device. The SLC mode restricts the number of programming states to which each MLC memory element may be programmed. In a specific embodiment, the SLC mode restricts each MLC memory element to be programmed in either an erase state or a state which is closest to a natural threshold voltage of the MLC memory element.

FIG. 1 illustrates a graphical diagram 10 of various programming states of a programming model that may be used in conjunction with a MLC mode. Each programming state includes a range of voltages, which correspond to the horizontal axis. The vertical axis corresponds to zero volts. Voltages to the left are negative voltages, and voltages to the right are positive voltages. Other conventions may be used to designate the voltages.

The natural threshold voltage, Vth (also designated as $V_{th}$), of the memory element is also identified. The natural threshold voltage of the memory element refers to a specific or approximate voltage level of the floating gate within the memory element. The natural threshold voltage is the voltage read from a newly manufactured memory element prior to executing an initial erase operation or write operation on the memory element. In this newly manufactured state there are no electrons on the floating gate of the memory element besides those that naturally exist in the floating gate material. In some embodiments, the natural threshold voltage is about 0.5V and can range between about 0.1V and about 0.6V, although other embodiments may have a different natural threshold voltage. The natural threshold voltage generally correlates with a value approximately at which an inversion layer is formed in the substrate of the memory element. For example, if the natural threshold voltage is about 0.5V, then the inversion layer may be formed having a gate bias of at 0.6V or higher voltages.

The programming states include four designated programming states ERASE, A, B, and C (shown with solid lines) and one intermediate state (shown with dashed lines). The solid lines represent a statistical distribution of voltages for a set of cells of a given state once a programming operation is completed. Solid lines for ERASE, A, B, and C states represent the possible states cells can take on when multiple bits of a MLC cell are programmed. In the illustrated example, the statistical distribution of voltages corresponding to the ERASE state spans from about −2.25V to about −1.5V. The statistical distribution of voltages corresponding to each of the other programming states span a range of about 0.5V—state A spans from about 0.5V to about 1.0V; state B spans from about 1.85V to about 2.35V; and state C spans from about 3.5V to about 4.0V. In other embodiments, the spans may be different and may start or end at different voltages.

The intermediate state also may be referred to as the low to middle (LM) state because it is between the state A and the state B. In the illustrated embodiment, the intermediate LM state spans from about 0.7V to about 1.6V, although other embodiments may use other statistical distribution of voltages for the intermediate LM state.

The term "designated programming states" is used herein to refer to the group of all states which are available for programming based on a manufacturer's design and implementation. For example, FIG. 1 includes at least four designated programming states (ERASE, A, B, and C), each of which is operational to maintain a programming state corresponding to a value for a bit (or values for multiple bits) of data. In some embodiments, an LM state serves as a fifth designated programming state, for maintaining a programming state corresponding to one or more bit values.

In the illustrated embodiment, the designated programming states ERASE and A-C represent bit combinations 11, 01, 00, and 10 (from the lowest voltage range to the highest voltage range). In this convention, the left bit is the most significant bit (MSB), and the right bit is the least significant bit (LSB). The intermediate state is designated as 10 in the intermediate LM state to indicate that the LSB is set to zero, but the MSB is not yet set to a specific bit value.

In operation, the designated programming state that represents the bit combination 11 is also designated as the erase state. When the MLC memory elements are erased, by default each MLC memory element is returned to the erase state, which represents the bit combination 11. In order to program the MLC memory element, the MLC memory element is either left in the default erase state (to represent a logical 0) or programmed to the intermediate LM state (to represent a logical 1).

Once the LSB is programmed, then the MSB may be programmed. If the LSB is 1 and the MSB is supposed to be 1, then the MLC memory element is maintained in the erase state, because the erase state corresponds to the bit combination 11. If the LSB is 1 and the MSB is supposed to be 0, then the MLC memory element is programmed to the state A corresponding to 01. If the LSB is programmed to 0, and the MSB is supposed to be 0, then the MLC memory element is programmed to the state B corresponding to 00. If the LSB is programmed to 0, and the MSB is supposed to be 1, then the MLC memory element is programmed to the state C corresponding to 10. This is just one example of bit combinations that may be assigned to the various programming states, according to a gray code programming model. Other embodiments may use other bit combinations assigned to the various programming states.

The MLC memory element is programmed in two or more phases. Programming the LSB is a first phase that places the MLC memory element in the erase state or the LM state. If all the pages of the MLC memory element are programmed using the multi-phase programming model, then certain cells may be programmed to transition from the LM state to either state B or state C, other cells may be programmed to transition from the erase state to state A, depending on the values that are programmed. This may be referred to as two-phase programming, because the programming is performed to the intermediate LM state in a first phase and then programmed to one of the states B or C in a second phase.

The intermediate LM state is used to program pages of the MLC memory element that use the LSB. Using an intermediate LM state allows pages using the LSB to be programmed while pages that use the MSB are not programmed and allows the state of a cell to take one of the states Erase, A, B, or C when two or more pages that include the cell are programmed. In contrast, if pages for the MSB of the MLC memory element are programmed then only states Erase and state A are used, as a result the intermediate LM state is not used.

Figure 2:
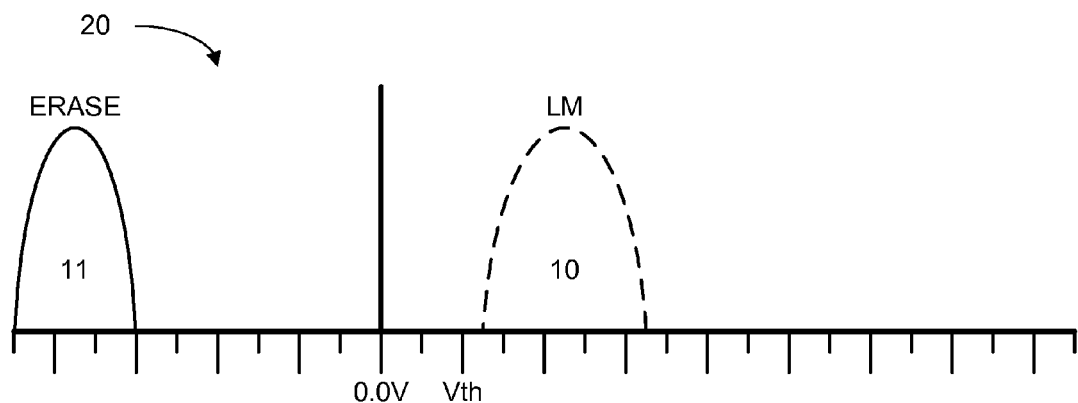
FIG. 2 illustrates a graphical diagram of programming states of one embodiment of a programming model which uses the LSB for the SLC mode.

FIG. 2 illustrates a graphical diagram 20 of programming states of one embodiment of a programming model which uses the LSB for the SLC mode. In this programming model, the value of the MSB may be irrelevant. The MLC memory element may be programmed to the erase state to represent a bit value of 1, or to the intermediate LM state or either of the states B or C above (i.e., to the right of) the intermediate LM state to represent a bit value of 0. Since the programming model illustrated in FIG. 2 only uses a subset of the designated programming states for representing bit values, these programming states are referred to herein as "restricted programming states." In general, restricted programming states include some, but not all, (i.e., an exclusive subset) of the designated programming states. In contrast, in this embodiment, the A, B, and C states of FIG. 1 are not used for any bit value representations, so the A, B and C states are not designated as restricted programming states.

Referring back to FIG. 1, in one embodiment, the restricted programming states comprise states ERASE and C. Such an embodiment may be advantageous where the storage media is a non-volatile storage media that does not have a natural threshold voltage such as a phase change memory and the like. In such an embodiment, use of states separated such as ERASE and C allow for more variation in the distribution of cells that are in each of the states.

Figure 3:
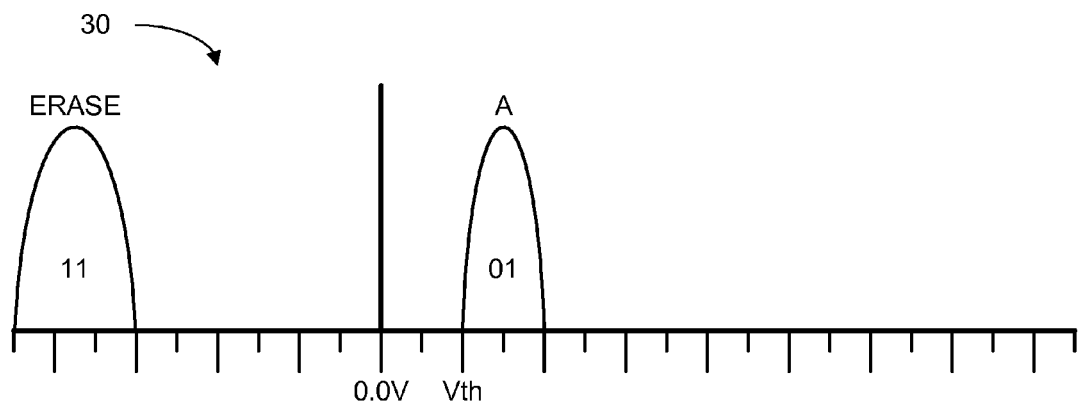
FIG. 3 illustrates a graphical diagram of programming states of one embodiment of a programming model which uses the MSB for the SLC mode.

FIG. 3 illustrates a graphical diagram 30 of programming states of one embodiment of a programming model which uses the MSB for the SLC mode. In this programming model, the value of the LSB remains 1. The MLC memory element may be programmed to the erase state to represent a bit value of 1 (a logical "0"), or to the state A to represent a bit value of 0 (a logical "1"). For reference, the state A represents the state that is closest to the threshold voltage Vth of the MLC memory element. Also, since the programming model illustrated in FIG. 3 only uses a subset (i.e., ERASE and A states) of the designated programming states for representing bit values, these programming states are referred to herein as "restricted programming states."

In some embodiments, by utilizing the state that is closest to the threshold voltage Vth of the MLC memory element for the SLC mode, the accuracy of the MLC device is maintained longer compared with using the MLC device in a MLC mode or using the MLC device in the SLC mode based on programming only pages that use the LSB. In this way, the longevity of the MLC device can be extended, because there is less programming voltage used to program the MLC memory elements to the lower voltage programming state.

Additionally, in some embodiments it is relatively unlikely that the MLC memory element might get overprogrammed relative to state A. In fact, even if the MLC memory element is overprogrammed relative to state A, the value of the MSB does not necessarily change between the states A and B, using the convention shown in FIG. 3.

Also, in certain embodiments, this approach using the MSB state for the SLC mode may take about the same amount of time to program the MLC memory element than using only the LSB state. Reading from MLC memory element that have only the MSB state programmed may take a little longer since the MLC memory element may perform two or more reads to verify that the cell voltage is within the erase state or the A state. Additionally, this approach results in the creation of less electron trapping sites within the gate of the MLC memory elements due to the lower programming voltage applied, which contributes to the longevity of the MLC memory elements. In some embodiments, using the MSB only in NAND MLC reduces the amount of trapping charges due to program/erase (P/E) cycling by lowering the voltage swing. If there are less trapped charges and/or trap sites, then there is low trap-assisted tunneling and path through a string of traps. Consequently, this also makes it less likely that the MLC memory element might be overprogrammed relative to state A. Moreover, there is very little voltage (Vt) drift of state A because the Vt level of state A is relatively close to the natural Vt level of the MLC memory element. This possibility of overprogramming typically increases with the age of the MLC device.

Typically in a MLC flash memory element, the number of electrons stored within a floating gate indicates a voltage differential that can be measured. The number of discrete levels that can be accurately determined is dependent upon the total number of electrons that can be stored and the maximum variation in number of electrons that can be controlled. Similarly, in a MLC phase-change memory element, the crystalline or amorphous nature of the memory element can be determined, and the number of discrete levels that can be accurately determined depends on the number of intermediate states that can be implemented between the crystalline and amorphous states. While any number of levels may be implemented, regardless of the specific technology used to implement the MLC memory elements, many MLC memory elements have four levels representing two bits of information. The encoding of these levels to the bit values they represent may use a gray code or other encoding mechanisms.

The two bits of a MLC, while sharing the same physical memory cell, may not be contiguous in a logical address space. In many cases, the bits are in different pages. However, the lower order addresses for the bits are frequently the same. Also, the bits of a single memory element are typically (but not always) within the same erase blocks. An erase block is a block of storage that is erased in bulk during an erase operation. The possible variations that might be implemented in different embodiments in terms of logical addresses, pages, erase blocks and so forth, may affect the operation of the device, but do not necessarily alter the fundamental concepts described herein for using a MLC device in a SLC mode.

Figure 4:
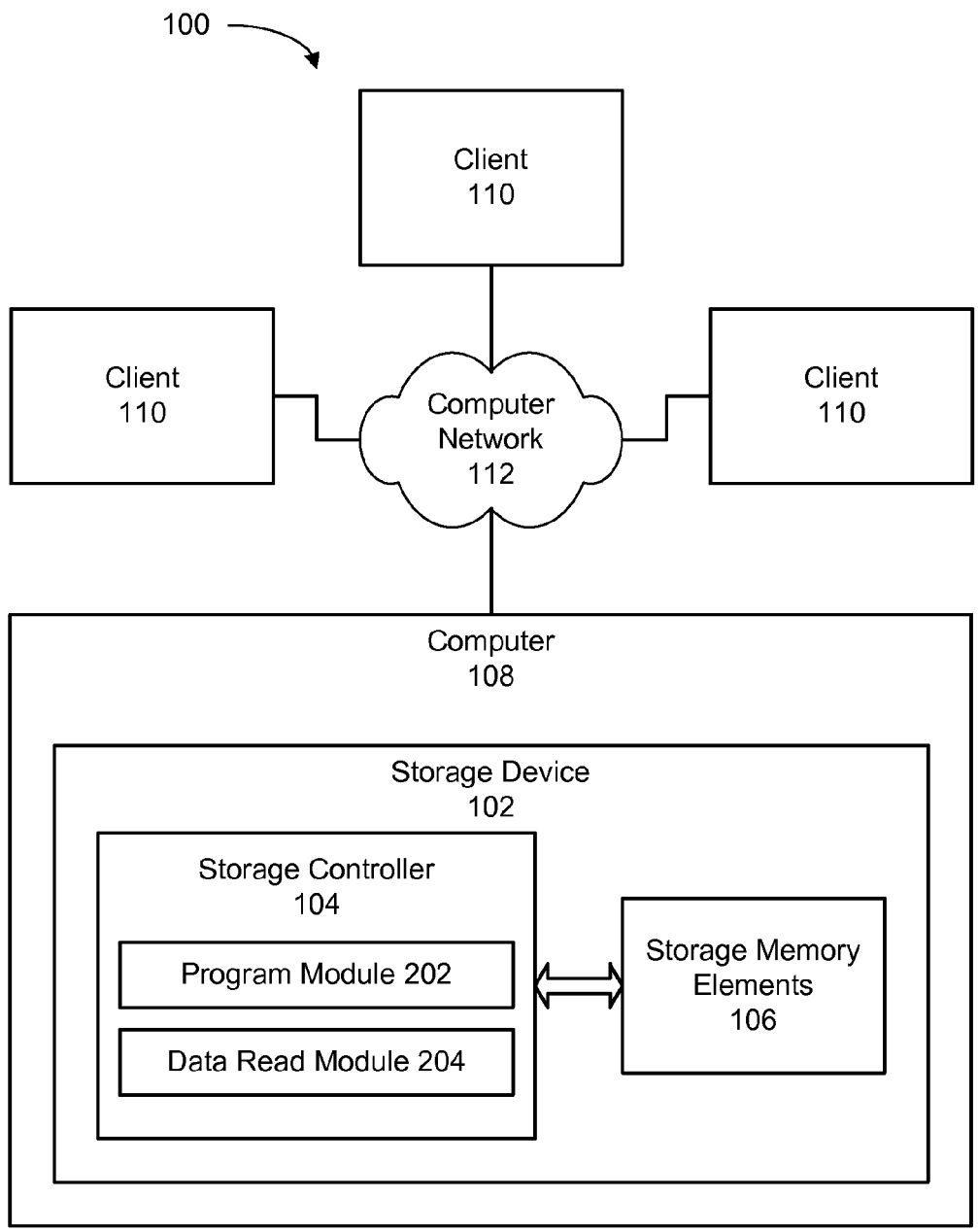
FIG. 4 illustrates a schematic block diagram of one embodiment of a network system.

FIG. 4 illustrates a schematic block diagram of one embodiment of a network system 100. The illustrated network system 100 includes a storage device 102 with a storage controller 104 and storage memory elements 106. The storage device 102 is implemented within a computer 108 connected to one or more clients 110 through a computer network 112. Embodiments of the depicted network system 100 may be implemented to provide dedicated or shared storage resources for one or more of the clients 110. Other embodiments of the network system 100 may be implemented to provide storage resources or capacity in another manner.

The storage memory elements 106 may be implemented in any type of MLC technology capable of storing a signal or charge representative of multiple bits in a single storage location. In one embodiment, the storage device 102 includes MLC solid-state memory elements that are capable of operating in a SLC mode. In general, solid-state memory elements can be set to different programmable states that correspond to different bits or bit combinations. In another embodiment, the storage device 102 includes phase-change memory (PCM) elements that are capable of operating in a MLC mode or SLC mode. In general, PCM elements can be switched between multiple states, including a crystalline state, an amorphous, and one or more intermediate states.

In one embodiment, the storage device 102 is internal to the computer 108 and is connected using a system bus, such as a peripheral component interconnect express ("PCI-e") bus, a Serial Advanced Technology Attachment ("serial ATA") bus, or the like. In another embodiment, the storage device 102 is external to the computer 108 and is connected to a universal serial bus ("USB") connection, an Institute of Electrical and Electronics Engineers ("IEEE") 1394 bus ("FireWire"), or the like. In other embodiments, the storage device 102 is connected to the computer 108 using a peripheral component interconnect ("PCI") express bus using an external electrical or optical bus extension or bus networking solution such as Infiniband or PCI Express Advanced Switching ("PCIe-AS"), or the like.

Each storage device 102 includes non-volatile, storage memory elements 106, such as flash memory, nano random access memory ("nano RAM or NRAM"), magnetoresistive RAM ("MRAM"), dynamic RAM ("DRAM"), phase change RAM ("PRAM"), etc. Although the computer 108 is shown with a single storage device 102, other embodiments of the computer 108 may include more than one storage device 102. Similarly, multiple storage devices 102 may be implemented at various locations within the nodes of the computer network 112.

In various embodiments, the storage device 102 may be in the form of a dual-inline memory module ("DIMM"), a daughter card, or a micro-module. In another embodiment, the storage device 102 is an element within a rack-mounted blade. In another embodiment, the storage device 102 is contained within a package that is integrated directly onto a higher level assembly (e.g., mother board, laptop, graphics processor, etc.). In another embodiment, individual components including the storage device 102 are integrated directly onto a higher level assembly without intermediate packaging.

The illustrated computer 108 is representative of one or more computers 108 coupled to each other and/or to the computer network 112. The computer 108 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, the computer 108 may be a client (similar to the clients 110), and the storage device 102 operates autonomously to service data requests sent from the computer 108. In this embodiment, the computer 108 and storage device 102 may be connected using the computer network 112, system bus, or other communication means suitable for connection between a computer 108 and an autonomous storage device 102.

Each client 110 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like.

The computer network 112 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination or portion(s) of networks. The computer network 112 also may include a network from the IEEE 802 family of network technologies, such Ethernet, token ring, WiFi, WiMax, and the like.

The computer network 112 may include addition network nodes or components such as servers, switches, routers, cabling, radios, and other equipment used to facilitate the network connection between the computer 108 and the clients 110. In one embodiment, the network system 100 includes multiple computers 108 that communicate as peers over the computer network 112. In another embodiment, the network system 100 includes multiple storage devices 102 that communicate as peers over the computer network 112.

For a storage device 102 that is designed to operate in a MLC mode, the storage controller 104 provides functionality to utilize the storage memory elements 106 in a SLC mode. In some embodiments, the storage controller 104 may operate the storage memory elements 106 in either a MLC mode or a SLC mode. Alternatively, the storage controller 104 may change between MLC and SLC operating modes for the storage memory elements 106, depending on certain criteria. By operating the storage memory elements 106 in the SLC mode, certain operating benefits may be achieved including, for example, increased longevity of the storage device 102.

The illustrated storage controller 104 includes a program module 202 and a data read module 204. In one embodiment, the program module 202 programs one or more bits of a MLC memory element 106 of the storage device 102. In certain embodiments, the program module 202 programs the MLC memory element 106 in a SLC mode so that the MLC memory element 106 stores a single bit of data. While operating in the SLC mode, the program module 202 may program the MSB of each MLC memory element 106. Regardless of the convention used to designate the MSB and LSB of each MLC memory element 106, in some embodiments the program module 202 uses the bit that corresponds to the programming state closest to the natural threshold voltage of the MLC memory element 106.

In one embodiment, the data read module 204 reads at least one data bit within the MLC memory element 106. If the storage device 102 is operating in the SLC mode, then the data read module 204 may read only a single bit from the MSB page of the MLC memory elements 106. If the storage controller 104 uses the erase state and the programming state closest to the natural voltage threshold of the MLC memory element 106, then the data read module 204 may read the MSB page once from each MLC memory element 106.

In some embodiments, each MLC memory element 106 is a cell that has $2^X$ possible programming states, where X is equal to the number of bits per memory element 106. For example, a MLC memory element 106 may store two bits of information and, accordingly, have four possible programming states. As another example, a MLC memory element 106 may store three bits of information and, accordingly, have eight possible programming states.

The MLC memory element 106 operating in SLC mode stores at least a most significant bit (MSB). In certain embodiments, even though the MSB and the LSB are part of the same physical multi-level memory cell 402, the MSB and the LSB may be assigned to different logical pages of the media. In certain embodiments, a plurality of the MLC memory elements 106 is logically organized as a page on the storage device 102. A page may be used as the designation of the smallest unit that can be written to the storage device 102. Moreover, the MLC memory element 106 may be associated with a page pair. A page pair is a pair of pages (designated as upper and lower pages) that are associated with a single set of physical MLC memory elements 106. Page pairs also may be referred to as page tuples. In one example, a two-bit MLC memory element 106 is associated with a page pair, in which the MSB is associated with an upper page and the LSB is associated with a lower page. The specific convention used to correlate the MSB/LSB with the upper/lower pages in a particular embodiment does not necessarily limit other conventions that may be used in other embodiments. Thus, the MSB and LSB in the same MLC memory element 106 may have different logical addresses in the storage device 102.

In one embodiment, writes directed to the upper page of the MLC memory element 106 only change the MSB. This can be achieved by changing the programming state of the MLC memory element 106 from the erase state to the A state (See FIG. 3), in which case the value of the LSB is not changed.

Additionally, the write operations may be implemented in one or more stages, and each stage may include one or more incremental voltage level changes. For example, changing the state of a MLC memory element 106 from the erase state to state A may occur in a single programming phase over multiple incremental voltage level changes, each voltage level change increasing the voltage level of the MLC memory element 106 a fraction of the difference between the erase state and the A state. In another example, changing the state of a MLC memory element 106 from the erase state to the LM state may be performed in a single programming phase over a single voltage level change (with a relatively high programming voltage) or over multiple incremental voltage level changes (each using a relatively low programming voltage).

As one example of a write operation, a client (such as a file system software application, operating system application, database management systems software application, a client computer, a client device, or the like) may implement functionality to store data on the storage device 102. When the client sends the write request with the data to be written, in one embodiment the data is written exclusively to the upper page corresponding to the MSBs of the MLC memory element 102 associated with that page. As a result of the write operation, the MSBs in the various MLC memory elements 106 are changed, but the LSBs are not changed. Although there may be various ways to write data exclusively to one page or the other, in one embodiment the write operation may be implemented by following a page programming order defined by the manufacturer, but skipping the pages that correspond to the LSBs. In this way, the data can be written exclusively to the pages corresponding to the MSBs, while the pages corresponding to the LSBs are not used.

Similar to write operations, read operations may be performed in one or more stages, depending on the available functionality of the storage device 102. In some embodiments, a first read operation is performed to determine if the state voltage of the MLC memory element 102 is between the ERASE state and the A state, and then a second read operation is performed to distinguish between the B and C states. Once a programming state is identified, both the MSB and LSB may be known, because each programming state corresponds to two (or more) bits. However, when using a MLC memory element 106 in the SLC mode, it may be sufficient to derive only the MSB, depending on which is used to designate the SLC value of the MLC memory element 106.

In certain embodiments, the data bits are read in response to requests for data that has been stored on the storage device 102. If the storage device 102 is operating in the SLC mode, then the read request is directed to the upper page such that the MSB is returned from the corresponding MLC memory elements 106.

Although writing data exclusively to the upper page corresponding to the MSBs of the MLC memory elements 106 reduces the capacity of the storage device 102, in some embodiments the reliability and/or longevity of the storage device 102 is increased. More specifically, writing exclusively to the upper page may place less stress on the individual MLC memory elements 106 and, thereby, reduce instances of failure in the storage device 102. In addition, the manufacturer and consumer may take advantage of the lower cost of the MLC storage media while getting performance comparable to, or better than, conventional SLC storage media. Furthermore, some embodiments may use mapping logic to handle mapping the pages, and a manufacturer may easily switch between MLC and SLC media for the storage device 102, or different production runs, without having to make major redesigns each time.

Figure 5:
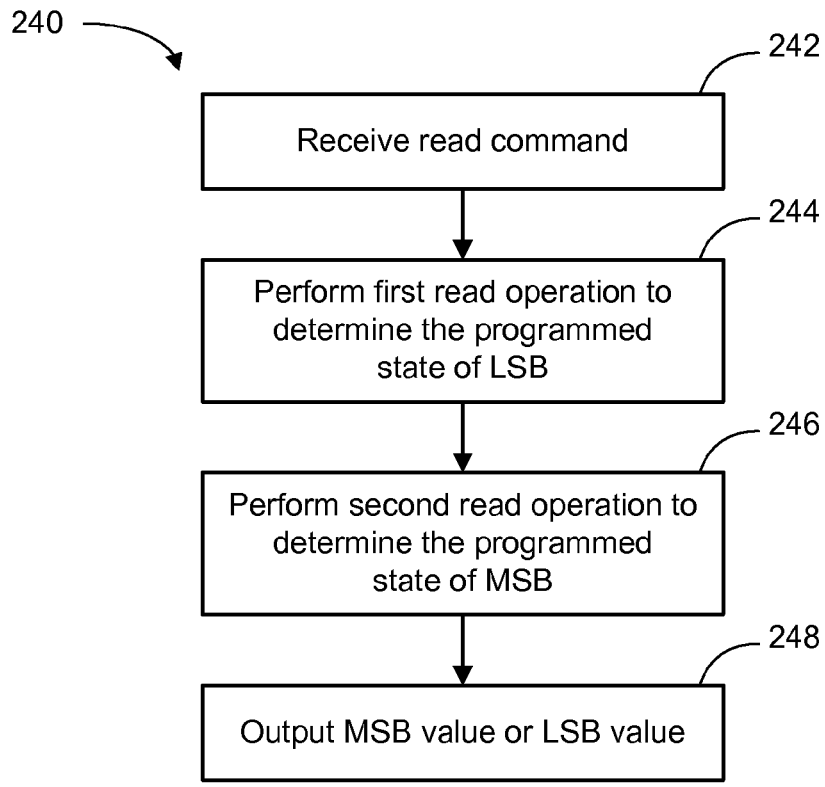
FIG. 5 illustrates a flow chart diagram of one embodiment of a method for reading data from the storage device of FIG. 1 using conventional multi-phase read operations.

FIG. 5 illustrates a flow chart diagram of one embodiment of a method 240 for reading data from the storage device 102 of FIG. 1 using conventional multi-phase read operations. This method 240 corresponds to the programming model shown in FIG. 1 which uses both the LSB and the MSB. Although the method 240 is described in conjunction with the storage device 102 of FIG. 1, embodiments of the method 240 may be implemented with other types of storage devices 102 and/or programming models.

The depicted method 240 begins in response to the storage device 102 receiving 242 a read command. The read command may include address information to indicate the location of the data to be read.

In response to the read command, the storage device 102 performs 244 a first read operation to determine the programmed state of the LSB. This operation is performed simply to determine if the LSB is programmed to the 0 state or 1 state.

The storage device 102 then performs 246 a second read operation to determine the programmed state of the MSB. If the MLC memory element 106 were operating in the MLC mode, then this read operation may be used to distinguish either between the erase state and the A state, or between the B state and the C state. The storage device 102 then outputs 248 the value of the MSB, which represents the SLC value of the MLC memory element 106. The depicted method 240 then ends. Further embodiments of the depicted method 240 may include additional steps or operations which are equivalent in function and/or result.

Figure 6:
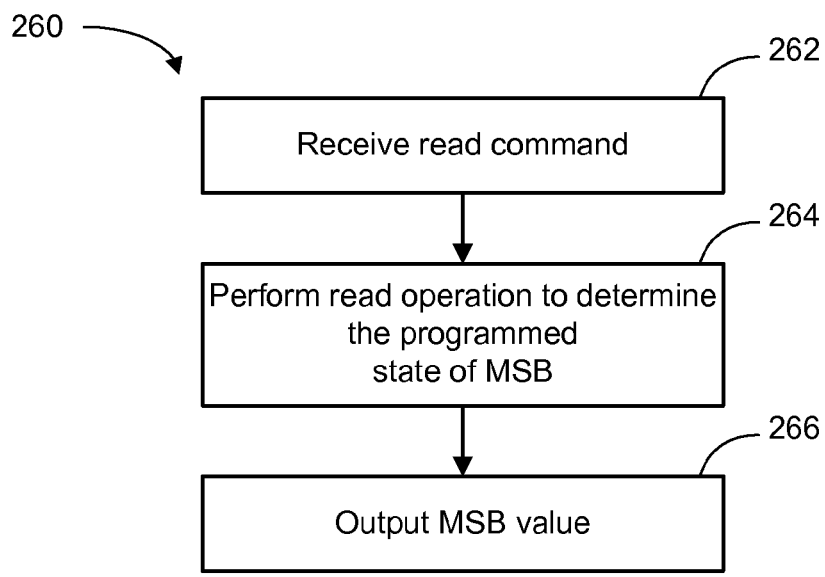
FIG. 6 illustrates a flow chart diagram of one embodiment of another method for reading data from the storage device of FIG. 1 using a single read operation.

In contrast to the multi-phase approach shown in FIG. 5, FIG. 6 illustrates a flow chart diagram of one embodiment of another method 260 for reading data from the storage device 102 of FIG. 1 using a single read operation. Such a single read operation may be possible if the manufacturer enables operation of MLC memory elements in a SLC mode that uses only the MSB pages, as described herein. Under such use conditions, the second read to distinguish between states B and C are not necessary because the LSB is not being utilized. Consequently, the MLC memory element may avoid the read latency by not performing this second read operation. The configuration of the MLC memory element to be operated in SLC mode using only the MSB state pages may be accomplished by default, in response to a command parameter, an initialization setting, or the like. This method 260 corresponds to the programming model shown in FIG. 3 which uses the MSB for the SLC mode. Although the method 260 is described in conjunction with the storage device 102 of FIG. 1 and the programming model of FIG. 3, embodiments of the method 260 may be implemented with other types of storage devices 102 and/or programming models.

The depicted method 260 begins in response to the storage device 102 receiving 262 a read command. The read command may include address information to indicate the location of the data to be read.

In response to the read command, the storage device 102 performs 264 the read operation to determine the programmed state of the MSB. In this embodiment, there is no need to determine the programmed state of the LSB. By performing only a single read operation, instead of multiple read operations, the total read time of the read operations can be reduced by about 60 microseconds relative to the read time of the multi-phase reading method 240 of FIG. 5.

In some embodiments, the storage device 102 may have built-in functionality that is capable of performing a read operation. However, in conventional storage devices 102, this type of read functionality may only be available when the storage device is operated in a manufacturer proprietary configuration. In embodiments of the storage device 102 described herein, this read functionality can be accessed and executed while the storage device 102 is operating in a SLC storage mode. In some embodiments, the read functionality can be dynamically initiated in response to a determination that the MLC memory elements 106 are operating in the SLC mode. In other embodiments, a user may manually access and initiate the read functionality outside of the manufacturer proprietary configuration of the storage device 106.

The storage device 102 then outputs 266 the value of the MSB, which represents the SLC value of the MLC memory element 106. The depicted method 260 then ends. Further embodiments of the depicted method 260 may include additional steps or operations which are equivalent in function and/or result.

As mentioned above, storing data in the MSB may impact the overall functionality of the storage device 102. In certain embodiments, the delay experienced in storing data in the MSB may be decreased and the MLC memory elements 106 may exhibit less tendency to have values in the MSB inadvertently shift. In addition, storing the data in the MSB may cause less wear on the MLC memory elements 106 for a particular programming operation. For example, referring to FIG. 3, using the MSB to store data may involve only the erase state and the A state as valid states. Since the A state uses a lower programming voltage (compared with the B and C states), the MLC memory element 106 may experience less wear and/or damage as it is used.

In some embodiments, it may be possible to dynamically switch between the MLC mode and the SLC mode. Additionally, it may be possible to dynamically switch between different SLC modes using the MSB or the LSB to store the data. For example, when the ability of the storage device 102 to reliably store data in the upper pages (MSB pages) is compromised, the storage device 102 may dynamically reconfigure write and read requests to exclusively store data in the lower pages (LSB pages), or vice versa. In one embodiment, this is done by only programming the pages that correspond to the MSB pages, the LSB pages, or any middle bit pages, are simply skipped in the addressing of the pages. Alternatively, this is done by only programming the pages that correspond to the LSB pages, the MSB pages, or any middle bit pages, are simply skipped in the addressing of the pages.

There may be one or more trigger events which initiate the dynamic switch between different modes (e.g., MLC, SLC using the LSB, and SLC using the MSB). Examples of some of the possible trigger events include, but are not necessarily limited to, an error count for MLC memory elements satisfying a threshold, P/E cycle count satisfying a threshold, and/or a change in storage capacity requirements (e.g., a need for more storage might trigger a switch from an SLC mode to the MLC mode). In some embodiments, a combination of trigger events may be used to initiate the dynamic switch between modes. In other embodiments, one or more other trigger events that are identifiable by one skilled in the art in light of the embodiments described herein may be used.

An embodiment of the storage device 102 includes at least one hardware-implemented processing device coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for storing data in an electronic memory device, the method comprising:
   receiving a write command to write data to an electronic memory device having multi-level cell (MLC) memory elements, wherein each MLC memory element is programmable to designated programming states, wherein each designated programming state is representative of at least two bits of data; and
   programming at least one of the MLC memory elements to one of a plurality of restricted programming states in a single-level cell (SLC) mode, wherein the restricted programming states exclude at least one of the designated programming states, and the restricted programming states comprise:
   a first state which is an erase state; and
   a second state, other than the erase state, which is closest to a natural threshold voltage of the MLC memory elements.

2. The method of claim 1, wherein programming the MLC memory element to one of the restricted programming states in the SLC mode further comprises programming the MLC memory element to represent a page bit within a page tuple.

3. The method of claim 2, wherein the page bit corresponds to a most significant bit (MSB) of a bit pair corresponding to one of the designated programming states.

4. The method of claim 3, wherein the first state represents a first binary value of the MSB, and the second state represents a second binary value of the MSB.

5. The method of claim 2, further comprising reading the MLC memory element by determining the restricted programming state to which the MLC memory element is programmed.

6. The method of claim 5, wherein determining the restricted programming state to which the MLC memory element is programmed further comprises performing a single read operation to determine whether the MLC memory element is programmed to the first state or the second state of the restricted programming states.

7. The method of claim 6, wherein the MLC memory element comprises a flash memory element.

8. The method of claim 1, wherein the restricted programming states comprise only a subset of the designated programming states to which the MLC memory element is programmable in a MLC mode.

9. The method of claim 1, further comprising dynamically switching between a MLC mode and the SLC mode in response to a trigger event by way of not addressing one or more pages comprising certain bits of the MLC memory elements.

10. The method of claim 1, further comprising dynamically switching between two SLC modes, wherein a first SLC mode uses a most significant bit (MSB) state to store the data, and a second SLC mode uses a least significant bit (LSB) state to store the data.

11. The method of claim 10, further comprising dynamically switching between two SLC modes in response to a trigger event.

12. A computer program product, comprising:
a computer readable storage device to store a computer readable program, wherein the computer readable program, when executed by a processor within a computer, causes the computer to perform operations for storing data in an electronic memory device, the operations comprising:
receiving a write command to write the data to an electronic memory device having multi-level cell (MLC) memory elements, wherein each MLC memory element is programmable to 2^X designated programming states, wherein each designated programming state is representative of X bits of data, where X>1; and
programming at least one of the MLC memory elements to one of a plurality of restricted programming states in a reduced-level cell (RLC) mode to represent Y bits of the data, where Y<X, wherein the restricted programming states exclude at least one of the designated programming states, and the restricted programming states comprise:
a first state which is an erase state; and
a second state, other than the erase state, which is closest to a natural threshold voltage of the MLC memory elements.

13. The computer program product of claim 12, wherein the computer program product, when executed by the processor within the computer, causes the computer to perform additional operations, comprising programming the MLC memory element to represent a page bit within a page tuple, wherein the page bit corresponds to a most significant bit (MSB) of a bit pair corresponding to one of the designated programming states.

14. The computer program product of claim 13, wherein the computer program product, when executed by the processor within the computer, causes the computer to perform additional operations, comprising reading the MLC memory element by determining the restricted programming state to which the MLC memory element is programmed.

15. The computer program product of claim 14, wherein the computer program product, when executed by the processor within the computer, causes the computer to perform additional operations, comprising performing a single read operation to determine whether the MLC memory element is programmed to the first state or the second state of the restricted programming states.

16. The computer program product of claim 12, wherein the restricted programming states comprise only a subset of the designated programming states to which the MLC memory element is programmable in a MLC mode.

17. The computer program product of claim 12, wherein the computer program product, when executed by the processor within the computer, causes the computer to perform additional operations, comprising dynamically switching between the SLC mode and a MLC mode in response to a trigger event by way of not addressing one or more pages comprising certain bits of the MLC memory elements.

18. The computer program product of claim 12, wherein the computer program product, when executed by the processor within the computer, causes the computer to perform additional operations, comprising dynamically switching between two SLC modes, wherein a first SLC mode uses most significant bit (MSB) states to store the data, and a second SLC mode uses least significant bit (LSB) states to store the data.

19. A controller for an electronic memory device having multi-level cell (MLC) memory elements, wherein each MLC memory element is capable of storing at least two data bits, the controller comprising:
a physical interface to couple the controller to the electronic memory device; and
a processing unit coupled to the physical interface, the processing unit to operate the electronic memory device in a single-level cell (SLC) mode using a restricted number of programming states for a single data bit, wherein the restricted number of programming states comprise:
a first state which is an erase state; and
a second state, other than the erase state, which is closest to a natural threshold voltage of the MLC memory elements.

20. The controller of claim 19, wherein the restricted programming states comprise only a subset of the designated programming states to which the MLC memory element is programmable in a MLC mode.

* * * * *